(12) United States Patent
Sakashita et al.

(10) Patent No.: US 7,544,244 B2
(45) Date of Patent: Jun. 9, 2009

(54) METHOD OF MANUFACTURING CERAMIC FILM AND STRUCTURE INCLUDING CERAMIC FILM

(75) Inventors: Yukio Sakashita, Kaisei-machi (JP); Takamichi Fujii, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 308 days.

(21) Appl. No.: 11/294,541

(22) Filed: Dec. 6, 2005

(65) Prior Publication Data

US 2006/0125352 A1    Jun. 15, 2006

(30) Foreign Application Priority Data

Dec. 9, 2004    (JP) ............................. 2004-357061
Nov. 16, 2005    (JP) ............................. 2005-331784

(51) Int. Cl.
*C30B 29/22* (2006.01)
(52) U.S. Cl. .................. 117/5; 117/7; 117/8; 117/9; 117/944
(58) Field of Classification Search .............. 117/5, 117/7, 8, 9, 944
See application file for complete search history.

(56) References Cited

U.S. PATENT DOCUMENTS

| | | | | |
|---|---|---|---|---|
| 2002/0015797 | A1* | 2/2002 | Hunt et al. | .......... 427/448 |
| 2005/0019551 | A1* | 1/2005 | Hunt et al. | .......... 428/323 |
| 2007/0122610 | A1* | 5/2007 | Hatono et al. | .......... 428/312.2 |

FOREIGN PATENT DOCUMENTS

| | | |
|---|---|---|
| JP | 4-188503 A | 7/1992 |
| JP | 2004-43893 A | 2/2004 |

* cited by examiner

*Primary Examiner*—Robert M Kunemund
(74) *Attorney, Agent, or Firm*—Sughrue Mion, PLLC

(57) ABSTRACT

A method of manufacturing a ceramic film by using an AD method, by which a film having good crystallinity can be fabricated without using a high-temperature process. The method of manufacturing a ceramic film by using an aerosol including the steps of: (a) dispersing ceramic raw material powder containing an amorphous component in a gas to generate an aerosol; and (b) supplying the aerosol generated at step (a) into a chamber in which a substrate is placed and depositing the ceramic raw material powder on the substrate to form a ceramic film.

18 Claims, 7 Drawing Sheets

POSITION

METHOD OF MANUFACTURING CERAMIC FILM AND STRUCTURE INCLUDING CERAMIC FILM

BACKGROUND OF THE INVENTION

1. Field of the Invention

The present invention relates to a method of manufacturing a ceramic film to be used in a piezoelectric actuator and an ultrasonic transducer, etc., and further relates to a structure including the ceramic film.

2. Description of a Related Art

A structure in which electrodes are formed on both sides of a piezoelectric material is utilized in various applications such as a piezoelectric actuator, a piezoelectric pump, an inkjet printer head, or an ultrasonic transducer. In recent years, with the developments of MEMS (micro electromechanical systems) related devices, elements having such multilayered structure shave been microfabricated still further and packaged more densely. Accordingly, microfabrication and improvement in performance are desired for the piezoelectric material to be used therein.

Under the circumstances, recent years, in order to form a piezoelectric material layer without mixing a binder, film formation methods utilizing a collision and deposition phenomenon of solid particles, such as an aerosol deposition (AD) method, a gas deposition method and so on, have attracted attention. For example, the AD method is a method of depositing a raw material on a substrate by injecting an aerosol formed by dispersing fine particles of the raw material in a gas from a nozzle toward the substrate and allowing the fine particles to collide against the substrate or a previously formed film. According to the AD method, a dense and strong thick film can be formed.

Further, Japanese Patent Application Publication JP-A-4-188503 discloses a method of manufacturing a ceramic dielectric product by forming a ceramic dielectric thick film layer having a thickness of 1 μm to 20 μm by suspending ceramic dielectric material fine particles having particle diameters of 1 μpm or less in a gas to form an aerosol and injecting the aerosol of ceramic dielectric material fine particles on a substrate via a nozzle at a high speed to deposit the particles thereon (page 1, FIG. 2).

Further, Japanese Patent Application Publication JP-P2004-43893A discloses a method of forming a ceramic film by spraying an aerosol containing ceramic powder on a substrate to grow a film on the substrate and allowing the ceramic powder to collide against the substrate in order to form a ceramic film with high crystallinity, wherein ceramic film formation is performed by employing ceramic powder having such high crystallinity that the half maximum fullwidth of the greatest intensity diffraction line peak of an X-ray diffraction line when using Cu—Kα ray is less than 0.3° (page 1, FIG. 1). That is, JP-P2004-43893A describes that it is important to make the crystallinity of the raw material powder higher in order to improve crystallinity of a ceramic film.

By the way, generally, the piezoelectric performance in a piezoelectric material largely depends on the degree of crystal orientation (rate of orientation). That is, the higher the degree of crystal orientation, the easier the alignment of polarization orientation when polarizing treatment is performed on the piezoelectric material, and good piezoelectric performance can be obtained. Here, the degree of orientation refers to a rate of crystal faces oriented toward a specific direction among crystal faces contained in a polycrystalline body. For example, the degree of orientation F(%) in c-axis is defined by the following equation.

$$F(\%) = (P - P_0)/(1 - P_0) \times 100 \quad (1)$$

In the equation (1), $P_0$ is X-ray diffraction intensity in c-axis of a completely randomly oriented polycrystalline body, i.e., a ratio $\{\Sigma I_0(0\,0\,L)/\Sigma I_0(H\,K\,L)\}$ of a total $\Sigma I_0(0\,0\,L)$ of reflection intensity $I_0(0\,0\,L)$ from a face (0 0 L) of the completely randomly oriented polycrystalline body to a total $\Sigma I_0(H\,K\,L)$ of reflection intensity $I_0(H\,K\,L)$ from the respective faces (H K L) of the polycrystalline body. Further, in the equation (1), P is X-ray diffraction intensity in c-axis of a sample, i.e., a ratio $\{\Sigma I(0\,0\,L)/\Sigma I(H\,K\,L)\}$ of a total $\Sigma I(0\,0\,L)$ of reflection intensity $I(0\,0\,L)$ from a face (0 0 L) of the sample to a total $\Sigma I(H\,K\,L)$ of reflection intensity $I(H\,K\,L)$ from the respective faces (H K L) of the sample. Each of H, K, and L takes an arbitrary integer number equal to "0" or more.

Here, in the equation (1), $P_0$ is a known constant. Therefore, in the case where the total $\Sigma I(0\,0\,L)$ of reflection intensity $I(0\,0\,L)$ from a face (0 0 L) and the total $\Sigma I(H\,K\,L)$ of reflection intensity $I(H\,K\,L)$ from the respective faces (H K L) are equal, that is, the degree of orientation F(%) in c-axis of the sample becomes 100%.

For example, in PZT (Pb(lead) zirconate titanate) as a representative piezoelectric material, the largest piezoelectric displacement is obtained when oriented in <0 0 1> direction in the tetragonal system, while the largest piezoelectric displacement is obtained when oriented in <1 1 1> direction in the rhombohedral system. Contrary, in a polycrystalline body with uncontrolled orientation, the crystal axis is randomly oriented, and therefore, the piezoelectric performance is inferior to that of the single-crystal body or polycrystalline body with controlled orientation. Accordingly, it is desired that the crystallinity can be made higher in the polycrystalline body for increasing the piezoelectric performance and the orientation can be controlled for increasing the degree of orientation.

However, according to the above-mentioned AD method, although a strong film with high adhesion can be formed, high heat treatment temperature is required for improving the crystallinity. Practically, the crystallinity and the piezoelectric performance of the PZT film are improved by annealing (heat-treatment) at high temperature near 1000° C. after film formation. Further, the orientation of the crystal faces is not controlled in the AD method. Accordingly, although the film formation itself by the AD method can be performed at temperature up to a ceiling of about 600° C., it is necessary to provide high energy to the film in a high-temperature process or the like in order to obtain sufficient piezoelectric performance for practical use.

SUMMARY OF THE INVENTION

The present invention has been achieved in view of the above-mentioned problems. A first object of the present invention is to manufacture a ceramic film having good crystallinity by using a film formation method such as the AD method utilizing a collision and deposition phenomenon of solid particles without using a high-temperature process. Further, a second object of the present invention is to reduce the energy required for manufacturing a ceramic film having good crystallinity by using such a film formation method. Furthermore, a third object of the present invention is to manufacture a ceramic film oriented in a predetermined direction relative to a substrate surface by using such a film formation method.

In order to solve the above-mentioned problems, a method according to a first aspect of the present invention is a method of manufacturing a ceramic film by using an aerosol and includes the steps of: (a) dispersing ceramic raw material powder containing an amorphous component in a gas to generate an aerosol; and (b) supplying the aerosol generated at step (a) into a chamber in which a substrate is placed and depositing the ceramic raw material powder on the substrate to form a ceramic film.

Further, a method according to a second aspect of the present invention is a method of manufacturing a ceramic film by using an aerosol and includes the steps of: (a) dispersing ceramic raw material powder containing a component, which produces exothermic reaction by being provided with energy from the outside, in a gas to generate an aerosol; and (b) supplying the aerosol generated at step (a) into a chamber in which a substrate is placed and depositing the ceramic raw material powder on the substrate to forming a ceramic film.

Furthermore, a method according to a third aspect of the present invention is characterized in that, in the above-mentioned methods, step (b) includes depositing the ceramic raw material powder on a single-crystal substrate to form the ceramic film according to orientation of the single-crystal substrate.

A structure according to a first aspect of the present invention includes: a substrate; and a ceramic film formed by depositing an aerosol of ceramic raw material powder containing an amorphous component on the substrate.

Further, a structure according to a second aspect of the present invention includes: a substrate; and a ceramic film formed by depositing an aerosol of ceramic raw material powder containing a component, which produces exothermic reaction by being provided with energy from the outside, on the substrate.

Furthermore, a structure according to a third aspect of the present invention is characterized in that, in the above-mentioned structures, the substrate is a single-crystal substrate and the ceramic film has orientation according to orientation of the single-crystal substrate.

According to the present invention, the ceramic raw material powder containing an amorphous component having higher potential energy than that of the polycrystalline body or the ceramic raw material powder that produces exothermic reaction by being provided with energy from the outside is used in the film formation method using an aerosol such as the AD method, and therefore, a film having good crystallinity can be fabricated without requiring heating treatment or the like at relatively high temperature.

DESCRIPTION OF THE PREFERRED EMBODIMENTS

Figure 1:
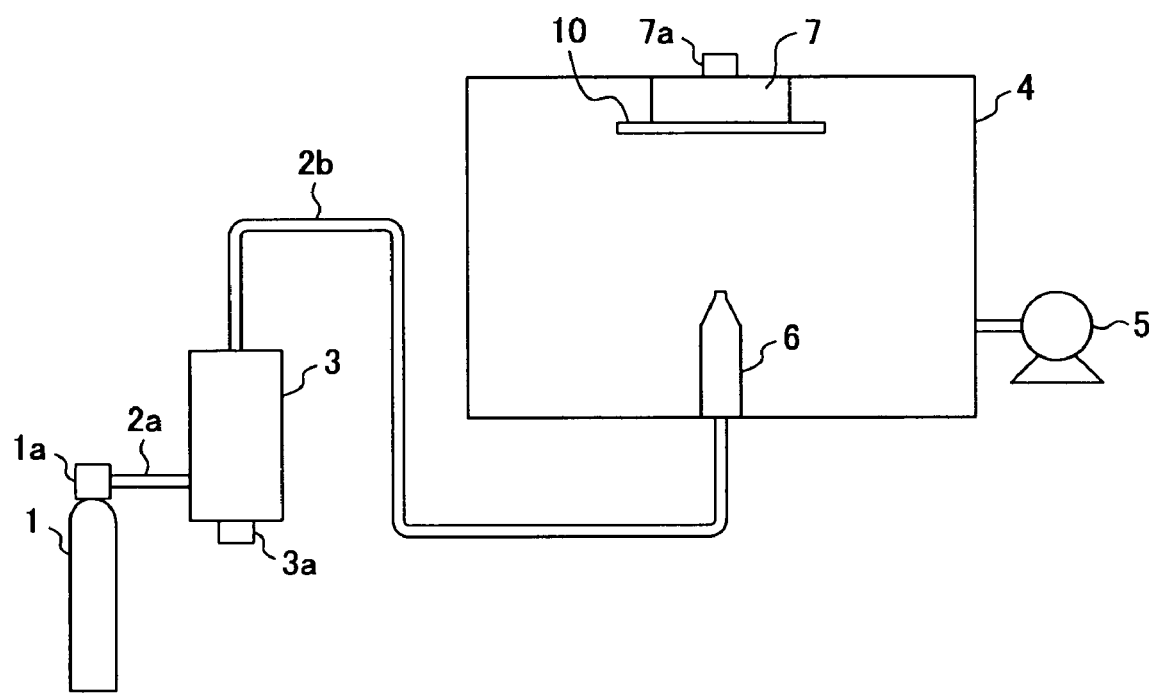
FIG. 1 is a schematic diagram showing a configuration of a film formation apparatus using the aerosol deposition (AD) method.

Hereinafter, embodiments of the present invention will be described in detail by referring to the drawings. The same reference numerals are assigned to the same component elements and the description thereof will be omitted.

FIG. 1 is a schematic diagram showing a film formation apparatus to be used in a method of manufacturing a ceramic film according to the first to fifth embodiments of the present invention. The film formation apparatus uses an aerosol deposition (AD) method of spraying an aerosol generated by dispersing fine powder of a raw material (raw material powder), which has been prepared in advance by another technique, on a substrate to form a film. Here, the AD method is one of film formation methods utilizing a collision and deposition phenomenon of solid particles.

The film formation apparatus shown in FIG. 1 includes a compressed gas cylinder 1, carrier pipes 2a and 2b, an aerosol generation chamber 3, a film formation chamber 4, an exhaust pump 5, and a nozzle 6 and a substrate holder 7 provided within the film formation chamber 4.

The compressed gas cylinder 1 is filled with nitrogen ($N_2$), oxygen ($O_2$), helium (He), argon (Ar), dry air, or the like to be used as a carrier gas. Further, in this compressed gas cylinder 1, a pressure regulation part 1a for regulating the supplied amount of the carrier gas is provided.

The aerosol generation chamber 3 is a container in which fine powder of a raw material (raw material powder) as a film formation material is placed. By introducing the carrier gas from the compressed gas cylinder 1 via the carrier pipe 2a to the aerosol generation chamber 3, the raw material powder located there is blown up to generate an aerosol. The generated aerosol is supplied to the nozzle 6 via the carrier pipe 2b. Further, the aerosol generation chamber 3 is provided with a container driving part 3a for agitating the raw material powder located within by applying vibration or the like to the aerosol generation chamber 3.

Various other known methods may be applied to the aerosol generation method as long as it can disperse powder in a gas. For example, an aerosol may be generated by inputting the raw material powder into a container in which airflow of the carrier gas has been formed.

The interior of the film formation chamber 4 is exhausted by the exhaust pump 5, and thereby, held at a predetermined degree of vacuum.

The nozzle 6 has an opening in a predetermined shape and size (e.g., about 5 mm in length and 0.5 mm in width), and injects the aerosol supplied from the aerosol generation chamber 3 toward a substrate 10 at a high speed. Thereby, the raw material powder in an aerosol state collides against the substrate or a deposit formed on the substrate (hereinafter, referred to "under layer"), adheres to the under layer and is deposited thereon.

The substrate holder 7 holds the substrate 10. Further, the substrate holder 7 is provided with a substrate holder driving part 7a for moving the substrate holder 7 in a three-dimensional manner. Thereby, the relative position and the relative speed between the nozzle 6 and the substrate 10 are controlled.

Figure 2A:
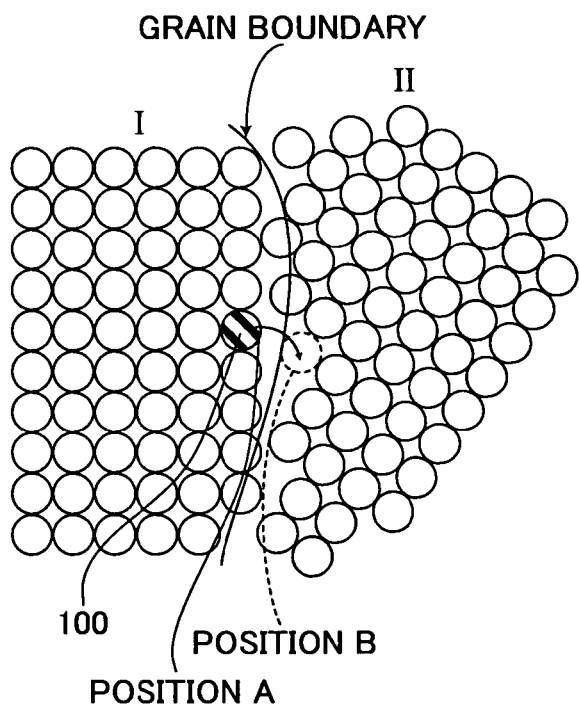
FIGS. 2A and 2B are diagrams for explanation of a mechanism of crystal grain growth.
Figure 2B:
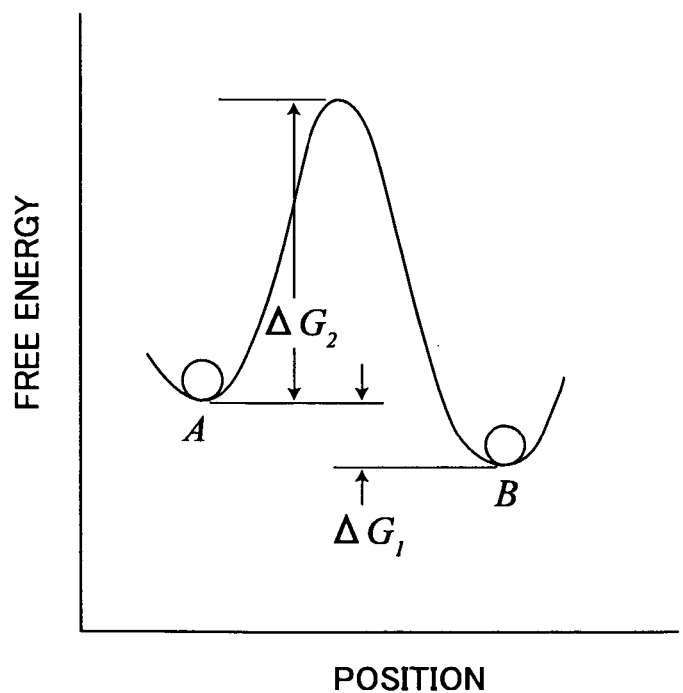
Figure 3:
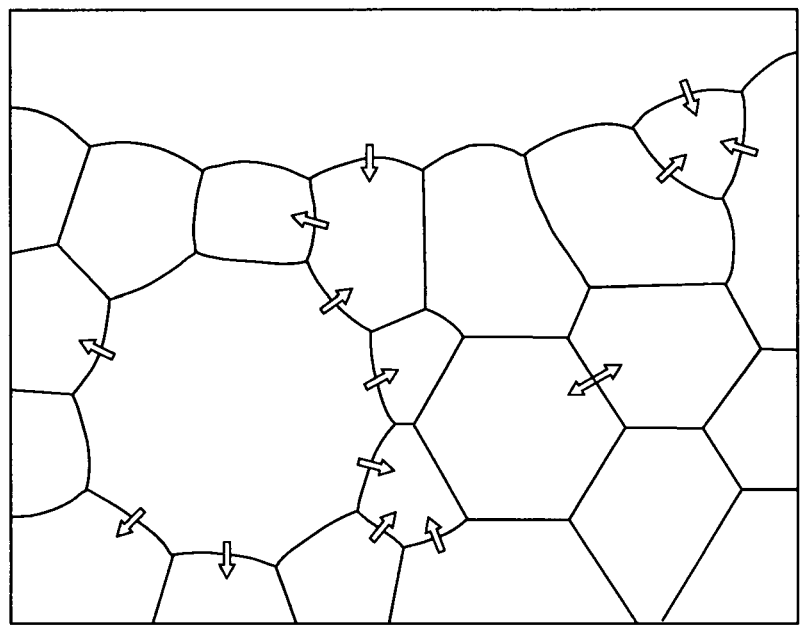
FIG. 3 is a diagram for explanation of a mechanism of crystal grain growth.

Next, a principle of a method of manufacturing a ceramic according to the present invention will be described in comparison with a general ceramic formation technology. FIGS. 2A, 2B, and 3 are diagrams for explanation of a mechanism of crystal grain growth.

Generally, ceramic is fabricated by sintering a green compact formed by compression molding of ceramic powder or a molded piece formed by mixing ceramic powder and a binder. Thereby, the ceramic becomes dense because of solid phase diffusion at temperature less than the fusing point, and the grain growth proceeds. The sintering process is divided into three main stages of early stage, middle stage and late stage.

First, in the early stage of sintering, rearrangement and coalescence of particles proceed, and a neck (constricted part where particles are in contact) grows thicker. At that time, pores existing between particles are trapped within the film.

Then, in the middle stage of sintering, the coalescence further proceeds, and spherical particles become polyhedral particles. Further, the pores formed within the film are contracted.

Here, referring to FIG. 2A, interfacial energy accompanies an interface (grain interface) between crystal grain I and crystal grain II. Further, there is a difference of free energy (change in free energy when crossing the interface) $\Delta G_1$ expressed by equation (2) between both sides of a curved grain interface (e.g., between position A and position B). In equation (2), $\gamma$ is interfacial energy, V is molar volume, and $r_1$ and $r_2$ are radiuses of principal curvature of two interfaces.

$$\Delta G_1 = \gamma V \{(1/r_1) + (1/r_2)\} \tag{2}$$

FIG. 2B shows change in free energy according to a position of an atom. Such free energy difference between materials existing on both sides of the grain interface serves as a driving force to move the grain boundary toward the center of the curvature thereof.

Accordingly, the crystal grain growth proceeds in the following mechanism. As shown in FIGS. 2A and 2B, an atom 100 at the left side (the position A) of the grain boundary gains activation energy $\Delta G_2$ to jump to the opposite position B of the grain boundary. Thereby, the grain boundary moves to the left in the drawing, and the crystal grain II grows as a result.

FIG. 3 schematically shows a state of crystal grain growth in the middle and late stages of sintering. Arrows in FIG. 3 indicate the directions of movement of grain boundary. As has been described referring to FIG. 2A and equation (2), the grain boundary moves toward the center of the curvature thereof, and therefore, there is a tendency for the grain boundary having sides less than six in number (that is, having an interface convex outward) to become smaller and the grain boundary having sides more than six in number (that is, having an interface convex inward) to become larger.

Furthermore, in the late stage of sintering, the pores within the film are contracted and vanished.

Compared to the general ceramic formation technology, in the AD method, a film is formed in the following mechanism. That is, the raw material powder is crushed by the shock when the raw material powder collides against the under layer, and thereby produced new crushed surface adheres to the under layer. Such a mechanism is called as mechanochemical reaction.

In the film formed according to the AD method (AD film), particles are densely coupled already at the time when the film is formed, there is no pore as in the early stage of sintering of the general ceramic formation technology. Therefore, heat treatment of AD film corresponds to the middle stage to the late stage of sintering of the general ceramic formation technology. Accordingly, in order to promote the crystal grain growth with respect to the AD film, it is important how smoothly the grain boundary is moved in the crystal tissue shown in FIG. 3. For this purpose, it is desirable that the energy larger than the activation energy $\Delta G_2$ is provided from the outside, or the activation energy $\Delta G_2$ is made smaller by making the energy state of the atom higher in advance.

Next, the case will be discussed where an AD film is formed by using raw material powder containing a noncrystalline component, raw material powder having a pyrochlore structure, or raw material powder containing a component which produces exothermic reaction by being provided with energy from the outside. These kinds of raw material powder have higher energy states than that of highly crystallized raw material powder. Here, the noncrystalline component is, in other words, a component having an amorphous structure. The amorphous structure is a structure having short-range order but not having long-range order like a crystal, and thermodynamically in a nonequilibrium metastable state. Further, the component, which produces exothermic reaction by being provided with energy from the outside, refers to a component which produces chain exothermic reaction by itself when deposited on a heated substrate or colliding with the under layer or another raw material powder, or a component which produces chain exothermic reaction when heated in the heat treatment process after film formation. As such a component, for example, gel powder containing an organic material is cited. The gel powder refers to powder manufactured according to the sol-gel method.

Figure 4:
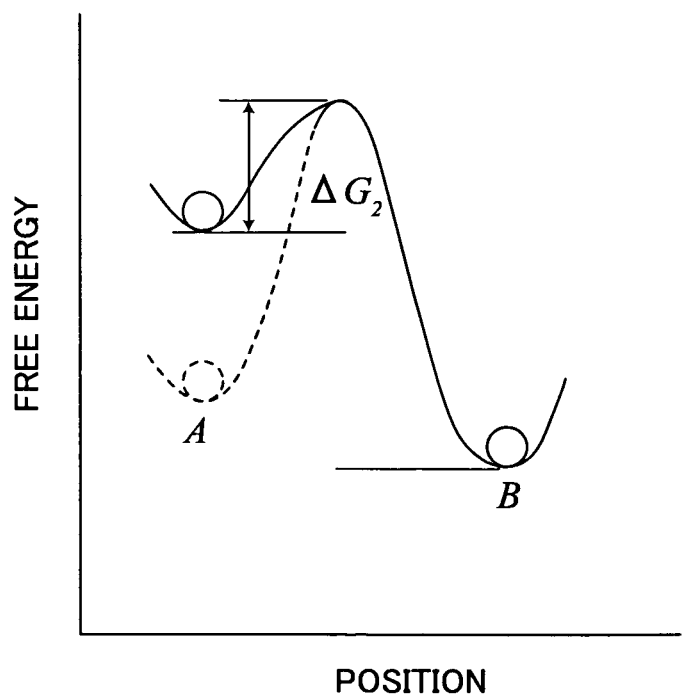
FIG. 4 shows change in free energy according to a position of an atom in the case where an energy state is high.
Figure 5:
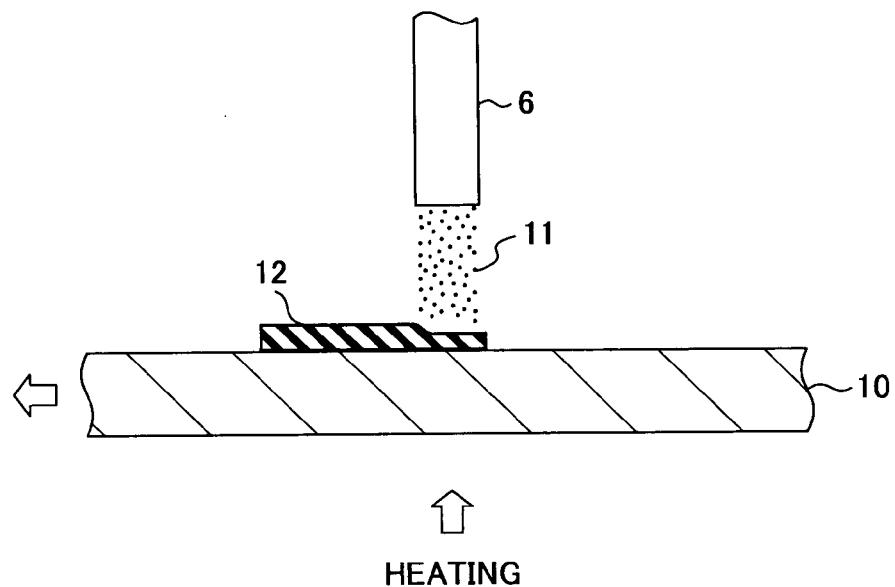
FIG. 5 is a diagram for explanation of a method of manufacturing a ceramic film according to the first embodiment of the present invention.

The AD film fabricated by using such raw material powder is already in a state in the middle stage to the late stage of sintering similarly to the normal AD film that has been described above. However, the raw material powder containing the amorphous component originally has a high energy state. Accordingly, as shown in FIG. 4, the activation energy $\Delta G_2$ required for an atom located at one side of the grain boundary to jump to the opposite side of the grain boundary becomes smaller than that for a polycrystalline raw material powder. Further, in the case of using gel powder, the thermal energy, which is generated by the chain exothermic reaction in the gel powder when film formation is performed on a heated substrate or at the time of heat treatment after film formation, is utilized as activation energy for an atom.

Accordingly, in the present application, film formation is performed according to the AD method by using the raw material powder having an amorphous component or the component which produces exothermic reaction by being provided with energy from the outside. This is because the energy provided from the outside for promoting the crystal grain growth in the AD film can be held down thereby. Here, the energy provided to the AD film includes thermal energy by post anneal (heat treatment), optical (electromagnetic) energy by ultraviolet light application or infrared light application, energy by plasma application and so on.

In the application, the raw material powder having an amorphous component may include not only raw material powder consisted only of amorphous components, but also raw material powder containing crystalline components to some extent. For example, a material containing a mixture of crystalline particles and amorphous particles, or a material containing particles having crystalline interior and amorphous exterior may be used. In any case, as long as the raw material powder has a degree of crystallinity of 50% or less, desirably 30% or less, more desirably 10% or less can be applied to the present invention.

Here, the degree of crystallinity X(%) is expressed by the following equation (3) using scattering intensity measured by an XRD (X-ray diffractometer).

$$X(\%) = (\Sigma I_C / \Sigma I_{C100}) \times 100 \quad (3)$$

In equation (3), $I_C$ represents a scattering intensity of a crystalline part in an unknown material, and $I_{C100}$ represents a scattering intensity of a sample having crystallinity of 100%. The sample having crystallinity of 100% includes, for example, a bulk sintered piece having sintered density of 95% or more.

Next, a method of manufacturing a ceramic film according to the first embodiment of the present invention will be described by referring to FIGS. 1 to 5. In the embodiment, the case where a PZT (Pb (lead) zirconate titanate) film is manufactured will be described.

First, as raw material powder, PZT precursor powder (fine particles) containing an amorphous component is prepared. Such PZT precursor powder can be fabricated by using a known method such as the sol-gel method including an alkoxide sol-gel method, a citrate sol-gel method and a polyol sol-gel method, or a urea homogeneous precipitation method. The particle diameter of the raw material powder is desirably about 2 µm or less.

Further, as a substrate on which the PZT film is formed, a substrate formed by SUS (stainless steel) 430 is prepared.

Then, the prepared substrate 10 is set in the substrate holder 7 shown in FIG. 1, and kept at a predetermined temperature (e.g., temperature at which the raw material powder is crystallized). Furthermore, the PZT precursor powder as a raw material is placed in the aerosol generation chamber 3 and the film formation apparatus is driven. Thereby, the PZT precursor powder 11 injected from the nozzle 6 collides against the substrate. At that time, if the substrate 10 has been heated, the PZT precursor having an amorphous structure is crystallized. A chain of such phenomena occurs, and thereby, a crystallized PZT film 12 is formed on the substrate.

As a working example, a PZT film having a thickness of about 10 µm is fabricated by using the method of manufacturing the ceramic film according to the embodiment. The PZT precursor powder as a raw material is fabricated according to the alkoxide sol-gel method and has an average particle diameter of about 0.3 µm and a particle diameter range from about 0.1 µm to about 1 µm. The degree of crystallinity of the raw material powder is 10% or less. Further, the film formation temperature (substrate temperature) is set at about 700° C.

From the measurement of the characteristics of the fabricated PZT film, the following result can be obtained. That is, when the measurement is performed by the X-ray diffraction method, only the diffraction peak from PZT is observed. Therefore, it can be confirmed that the PZT precursor having the amorphous structure has been crystallized. Further, the half maximum full-width of the diffraction peak representing a face (1 1 0) as a main peak of PZT is 0.25°. Furthermore, the piezoelectric distortion constant d31 measured by the cantilever method is 90 pm/V, and it can be confirmed that good piezoelectric performance is obtained.

As a comparative example, a PZT film having a thickness of about 10 µm is fabricated by using the film formation apparatus as shown in FIG. 1 and PZT polycrystalline powder having an average particle diameter of about 0.3 µm and a particle diameter range from about 0.1 µm to about 1 µm as raw material powder. The degree of crystallinity of the raw material powder is 60% or more. Further, the film formation temperature is set at three kinds of temperature of about 600° C., 700° C., and 800° C.

From the measurement performed on the comparative example according to the X-ray diffraction method, the half maximum full-width of the diffraction peak representing a face (1 1 0) of PZT is about 0.60 for the film formed at film formation temperature of about 600° C., about 0.45° for the film formed at film formation temperature of about 700° C., and about 0.4° for the film formed at film formation temperature of about 800° C. Further, in the comparative example, the piezoelectric distortion constant d31 measured by the cantilever method is 60 pm/V or less, which is lower than that of the working example.

Figure 6:
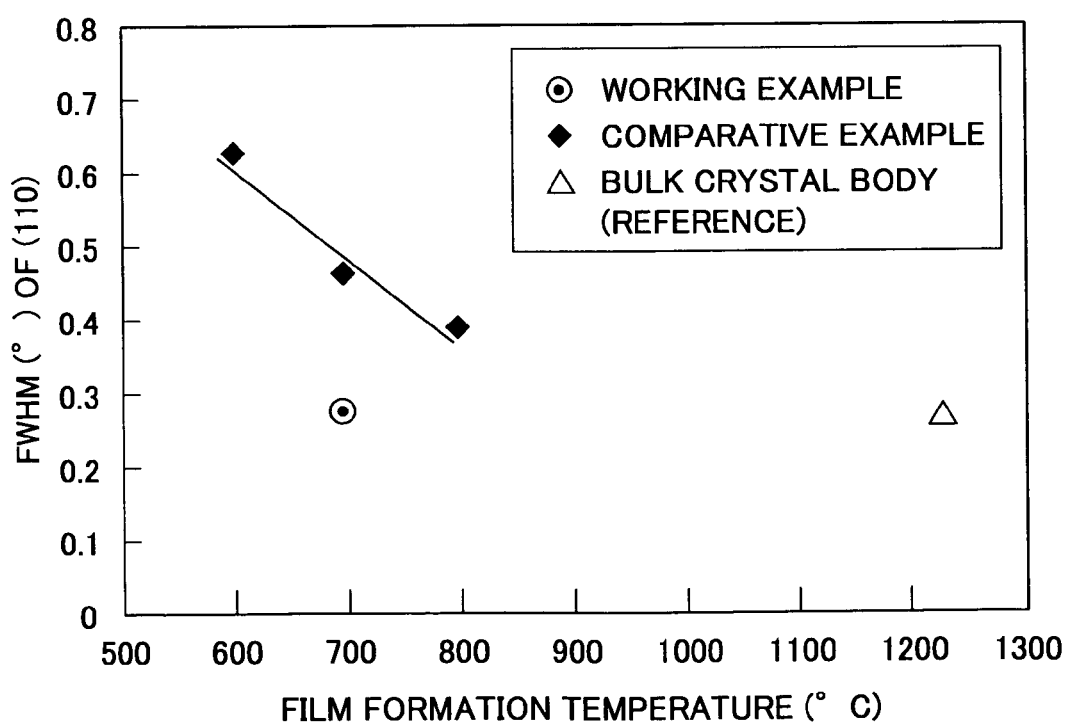
FIG. 6 shows half maximum full-widths of diffraction peak representing a face (1 1 0) of PZT films respectively fabricated by using the method of manufacturing a ceramic film according to the first embodiment of the present invention and a conventional method.

In FIG. 6, measurement results according to the X-diffraction method are shown as to the comparative example, the working example and a bulk sintered compact as reference. As clearly seen from FIG. 6, in the working example, although the film formation is performed at lower temperature than that in the comparative example (conventional method), a film having smaller half maximum full-width (FWHM) and good crystallinity can be formed. Furthermore, in the working example, although the film formation is performed at 700° C., the half maximum full-width equivalent to that of the bulk sintered compact that has been sintered at 1200° C. or more, that is, high crystallinity can be obtained. Thereby, the drastic reduction in temperature can be realized in the crystallization process.

Thus, according to the method of manufacturing a ceramic film according to the embodiment, a film having good crystallinity can be fabricated by the AD method without requiring a high-temperature process (e.g., at 1000° C. or more). Therefore, the range of choices of substrate materials to be used in the AD method can be expanded. For example, by setting the film formation temperature at 600° C. or less, a metal substrate of SUS or the like, a glass substrate, etc. can be used. Further, by setting the film formation temperature at 400° C. or less, a resin substrate can be used. Contrary, in the case where the film formation is performed at temperature equivalent to the conventional temperature, a ceramic film with higher crystallinity can be obtained.

In the embodiment, the PZT precursor powder containing little crystalline component has been used as raw material powder. However, even if it contains a crystalline component to some extent, a film having higher crystallinity than that of the conventional film can be obtained. That is, the required condition is that the PZT precursor powder contains a component having an amorphous structure and the degree of crystallinity of PZT in the fine particles is 50% or less, desirably 30% or less, and more desirably 10% or less. Here, sometimes the PZT precursor powder contains crystals other than PZT, i.e., a component having a polymeric structure containing lead (Pb), zircon (Zr) or titanium (Ti), and carbon (C). Therefore, it is defined that the component having the PZT crystalline structure does not include such a component.

In the AD method, since the raw material powder is allowed to collides against the under layer such as a substrate and deposited thereon, a phenomenon that the raw material powder cuts into the under layer sometimes occurs. The phenomenon is referred to as "anchoring". The thickness of the anchor layer (the layer into which the powder cuts) produced by the anchoring is generally on the order of 10 nm to 300 nm, which differs according to the material of the under layer, the powder velocity or the like. Therefore, by observing the interface between the substrate and the PZT film formed on the substrate, there is a case where whether the PZT film has been formed by the AD method or not can be determined.

Next, a method of manufacturing a ceramic film according to the second embodiment of the present invention will be described by referring to FIGS. 1 and 7.

First, as raw material powder, PZT precursor powder having an amorphous structure is prepared similarly to the above-mentioned first embodiment, and an AD film is formed on a substrate by using the film formation apparatus as shown in FIG. 1. In the embodiment, there is no need to raise the film temperature to more than normal temperature.

Figure 7:
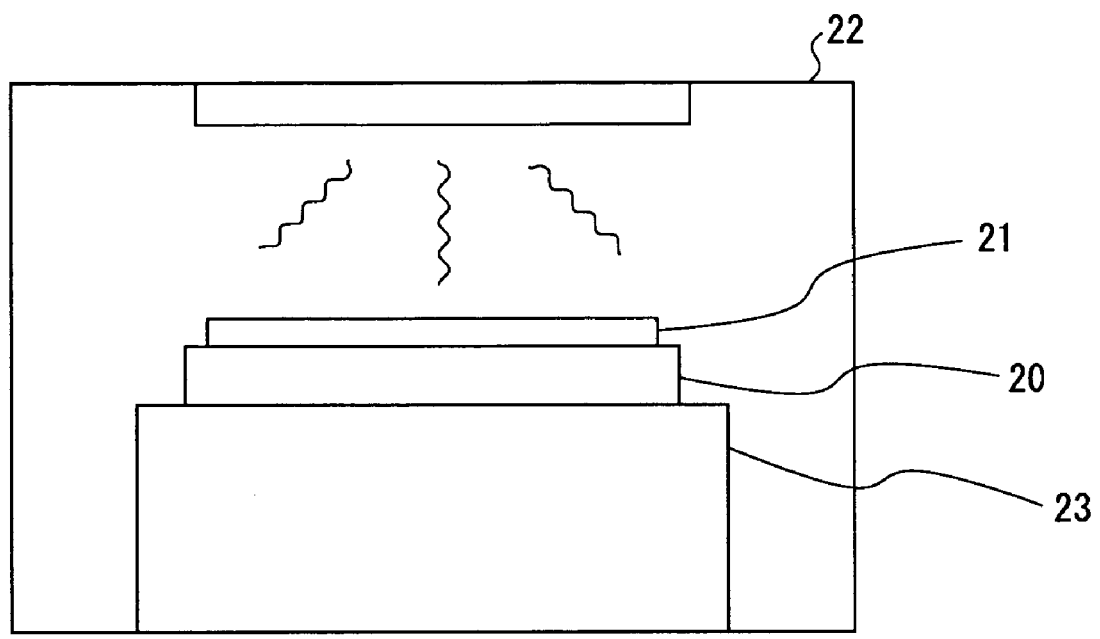
FIG. 7 is a diagram for explanation of a method of manufacturing a ceramic film according to the second embodiment of the present invention.

Then, as shown in FIG. 7, thus formed AD film 21 on a substrate 20 is taken out from the film formation apparatus, placed on a stage 23 within an infrared oven 22, and annealed at a predetermined temperature (e.g., 700° C.). Thereby, a component having an amorphous structure in the AD film 21 is provided with activation energy and crystallized.

Thus, according to the embodiment, in the post-anneal process after film formation, the anneal temperature can be reduced. Therefore, the range of choices of substrate materials can be expanded to a metal substrate such as SUS, a glass substrate, a resin substrate and so on that have been conventionally unusable in view of heat resistance.

Alternatively, in the case where anneal is performed at temperature nearly equal to that in general ceramic formation (e.g., about 1000° C.), the crystallinity can be further improved because the crystal grain growth can be promoted more efficiently than in the conventional case. Therefore, a ceramic film with higher performance can be obtained.

Next, a method of manufacturing a ceramic film according to the third embodiment of the present invention will be described.

First, PZT precursor powder having an amorphous structure is prepared similarly to the above-mentioned first embodiment, and an AD film is formed on a substrate by using the film formation apparatus shown in FIG. 1. In this regard, there is no need to raise the film temperature to more than normal temperature.

Figure 8A:
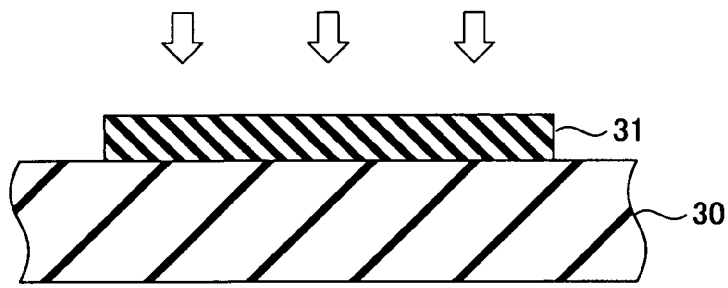
FIGS. 8A to 8C are diagrams for explanation of a method of manufacturing a ceramic film according to the third embodiment of the present invention.
Figure 8B:
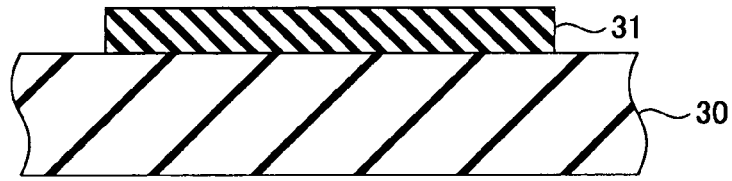
Figure 8C:
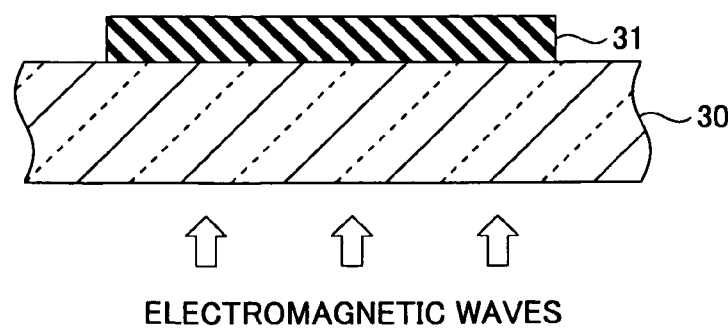

Then, as shown in FIGS. 8A to 8C, electromagnetic waves are applied to an AD film 31 formed on a substrate 30. A kind of the electromagnetic wave can be selected from among radio wave including microwave, infrared light, visible light, ultraviolet light, X-ray, etc. according to various conditions of AD film thickness, substrate material, etc. Here, the microwave refers to electromagnetic wave having a wavelength of 1 m to 1 mm, and includes UHF wave (decimeter wave), SHF wave (centimeter wave), EHF wave (millimeter wave) and submillimeter wave. For example, in the case where infrared light including an absorption wavelength of the AD film material (e.g., infrared light having a wavelength of 10.6 µm for PZT) is applied, molecules contained in the AD film absorb infrared energy and are heated. Further, in the case where ultraviolet light including an absorption wavelength of the AD film material (e.g., ultraviolet light having a wavelength of 248 nm for PZT) is applied, atoms contained in the AD film absorb ultraviolet energy and outer electrons transit and are activated. As a result, the component having the amorphous structure contained in the AD film is provided with activation energy and crystallized.

As to the direction in which the electromagnetic waves are applied, the electromagnetic waves may be directly applied from above the AD film as shown in FIG. 8A, or may be applied from the side of the AD film as shown in FIG. 8B in the case where electromagnetic waves having a relatively long wavelength are used. Alternatively, in the case where a substrate having permeability to the electromagnetic waves (e.g., in the case where a glass substrate is used to visible light), the electromagnetic waves may be applied from the substrate side toward the AD film as shown in FIG. 8C.

In the embodiment, heat treatment may be performed on the AD film simultaneously with the application of electromagnetic waves to the AD film. Thereby, the electromagnetic waves with lower energy can be used than in the case where the electromagnetic waves are singularly applied. Alternatively, heat treatment can be performed at lower temperature than in the case where only heating is performed.

Next, a method of manufacturing a ceramic film according to the fourth embodiment of the present invention will be described by referring to FIGS. 1 and 9.

First, as raw material powder, PZT precursor powder having an amorphous structure is prepared similarly to the above-mentioned first embodiment, and an AD film is formed on a substrate by using the film formation apparatus as shown in FIG. 1. In this regard, there is no need to raise the film temperature to more than normal temperature.

Figure 9:
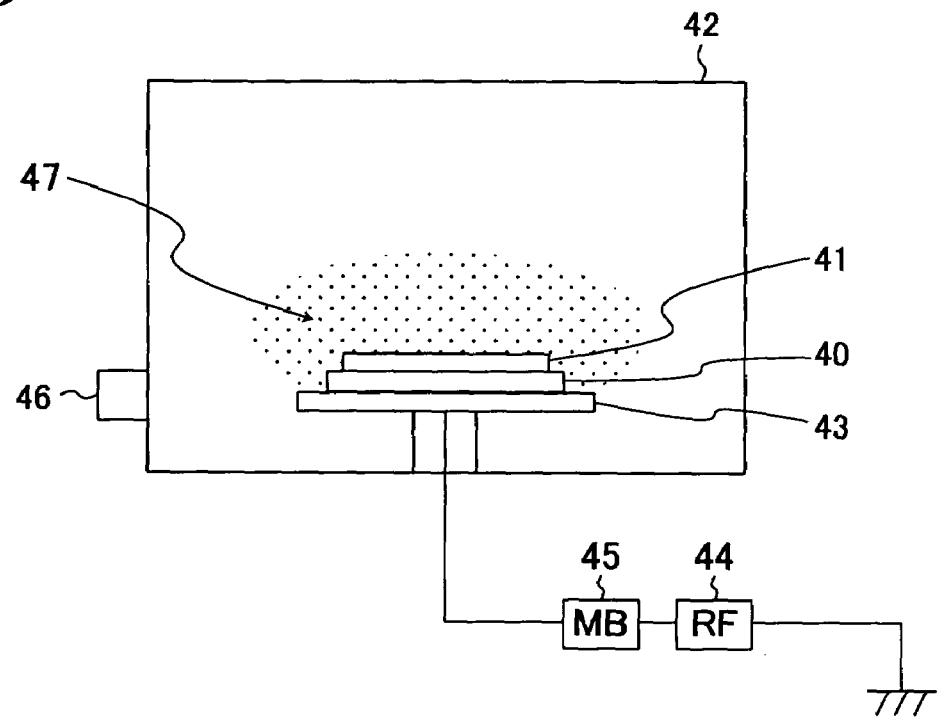
FIG. 9 is a diagram for explanation of a method of manufacturing a ceramic film according to the fourth embodiment of the present invention.

Then, as shown in FIG. 9, thus formed AD film 41 on a substrate 40 is taken out form the film formation apparatus and placed in a plasma generation chamber 42.

In the plasma generation chamber 42, a substrate holder 43 connected to a radio frequency power source (RF) 44 and a matching box (MB) 45 and an exhaust pump 46 are provided. The substrate holder 43 holds the substrate 40 and is used as an electrode for generating radio frequency discharge within the plasma generation chamber 42. It is desirable that the area of the substrate holder 43 is made nearly equal to or more than that of the substrate 40 so as to uniformize the electric field formed around the substrate 40.

The radio frequency power source 44 is, for example, a radio frequency power source for plasma generation for generating an alternating voltage having a frequency of 13.56 MHz. Further, the matching box 45 matches impedance between the load and the radio frequency power source 44 by cancelling the reactance component of the load. As the matching box 45, for example, a matching box employing a blocking capacitor may be used. The blocking capacitor cuts direct current components and passes only alternating current components.

The exhaust pump 46 is provided for decreasing pressure with in the plasma generation chamber 42. This is because local discharge and arc discharge are likely to occur when discharge is performed at near the atmospheric pressure. In order to stably generate discharge, the pressure is preferably set to from about $1\times10^{-1}$ Pa to about $1\times10^{3}$ Pa.

By operating such plasma generation chamber 42, plasma 47 is generated around the substrate 40 and the AD film 41. As a result, a component having an amorphous structure in the AD film 41 is provided with activation energy and crystallized.

Various known methods and apparatuses other than that shown in FIG. 9 may be used for generating plasma. For example, in the embodiment, glow discharge has been generated by using the radio frequency power source, however, corona discharge may be generated.

Further, also in the embodiment, both plasma application to the AD film and heating may be simultaneously performed by providing a heating source within the plasma generation chamber. Thereby, the plasma with lower energy can be used than in the case where the plasma is singularly applied. Alternatively, heat treatment can be performed at lower temperature than in the case where only heating is performed.

Figure 10:
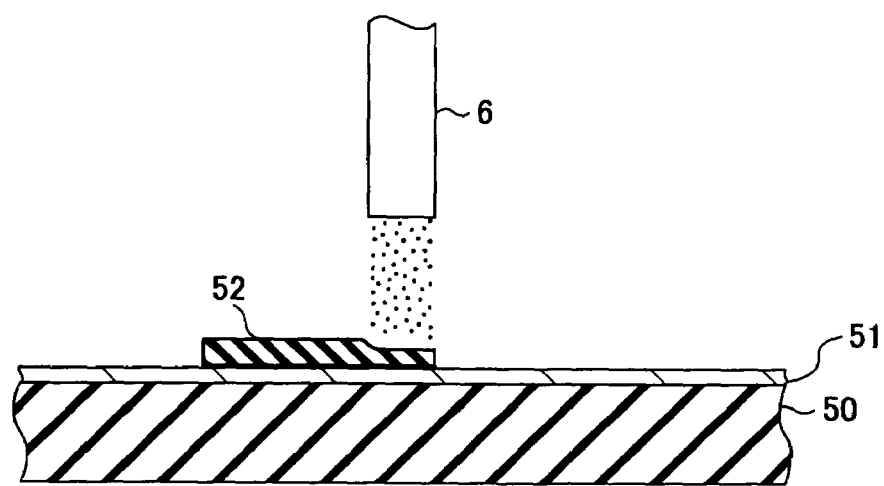
FIG. 10 is a diagram for explanation of a method of manufacturing a ceramic film according to the fifth embodiment of the present invention.

Next, a method of manufacturing a ceramic film according to the fifth embodiment of the present invention will be described by referring to FIGS. 1 and 10.

First, as raw material powder, PZT precursor powder having an amorphous structure is prepared similarly to the above-mentioned first embodiment. Further, as shown in FIG. 10, a single-crystal substrate 50 of magnesium oxide (MgO) or the like is prepared as a substrate on which a PZT film is formed, and a platinum film 51 oriented in a predetermined direction (e.g., a direction <1 0 0> or <0 0 1>) according to orientation of the single-crystal substrate 50 is formed on the principal surface thereof. The orientation film of platinum can be formed by using a known film formation technology such as sputtering. The platinum film 51 serves as a foundation for orienting the PZT crystal in a desired direction.

Then, the substrate 50 on which the platinum film 51 has been formed is set in the substrate holder 7 as shown in FIG. 1, and the PZT precursor powder is placed in the aerosol generation chamber 3 and the film formation apparatus is driven. Thereby, the raw material powder is injected from the nozzle 6 and deposited on the platinum film 51. As a result, a film 52 is formed. Furthermore, after the film 52 is formed to a predetermined thickness, the substrate 50 is taken out form the film formation apparatus and annealed at a predetermined temperature in an infrared oven or the like. Thereby, a non-crystalline component (a component having an amorphous structure) contained in the film 52 that has been formed on the substrate is crystallized while being oriented according to the crystal orientation of the single-crystal substrate 50 and the platinum film 51 as a foundation. As a result, a polycrystalline orientation film of PZT is obtained.

A PZT film having a thickness of about 10 µm is fabricated by using the method of manufacturing the ceramic film according to the embodiment. As the PZT precursor powder as a raw material, powder fabricated according to the alkoxide sol-gel method and having an average particle diameter of about 0.3 µm and a particle diameter range from about 0.1 µm to about 1 µm is used. From the measurement of the structure of the PZT precursor powder, no PZT crystalline component is observed. The orientation of the platinum electrode formed on the substrate is set to a direction <1 0 0>. Further, the anneal temperature is set at about 800° C.

The characteristics of the fabricated PZT film are measured. First, when the measurement is performed by the X-ray diffraction method, only the diffraction peak from PZT is observed. Therefore, it can be confirmed that the amorphous structure of the PZT precursor powder has been crystallized. Further, from the calculation with respect to the fabricated PZT film using the following equation, the degree of orientation in the direction <1 0 0> is 60% or more. That is, it can be confirmed that the crystal grain contained in the PZT film is strongly oriented in the direction <1 0 0>.

Degree of orientation $F(\%) = (P - P_0)/(1 - P_0) \times 100$

In the above equation, $P_0$ represents X-ray diffraction intensity in c-axis of a completely randomly oriented polycrystalline body and P represents X-ray diffraction intensity in c-axis of a sample.

Thus, due to the method of manufacturing a ceramic film according to the embodiment, a material having high potential energy is used as a starting material, and therefore, a polycrystalline film with controlled orientation can be fabricated without using a high-temperature process because of epitaxiality between the substrate or the foundation layer and itself. Accordingly, the performance of the ceramic film can be improved. By the way, the film has been annealed after film formation in the embodiment, however, film formation may be performed under predetermined film formation temperature as in the first embodiment, or electromagnetic waves or plasma may be applied to the film as in the third or fourth embodiment. Also in those cases, the crystallinity can be improved while controlling the orientation only by providing relatively low energy.

As described above, according to the first to fifth embodiments of the present invention, a film having good crystallinity and a film having a high degree of orientation can be fabricated without requiring a high-temperature process. Therefore, with respect to a substrate in which only a limited substrate material (e.g., expensive zirconia) has been conventionally used for requirement of high heat resistance, a substrate material such as metal, silicon, glass, and resin can be used. Thereby, the range of choices of devices to which a ceramic film is applicable can be expanded. Further, according to the first to fifth embodiments of the present invention, an advantage that a film having good crystallinity and a film having a high degree of orientation can be fabricated can be added to a feature of the AD film that a ceramic thick film with high adhesion and density can be fabricated in a dry process.

In the first to fifth embodiments of the present invention, for example, the case of fabricating a PZT film of about 10 µm has been described, however, a thinner film or thicker film can be fabricated by controlling the film formation speed and film formation time in the film formation apparatus shown in FIG. 1.

The PZT film fabricated using the method of manufacturing the ceramic film according to the first to fifth embodiments of the present invention can be utilized in a device requiring a relatively thick film (e.g., on the order of 1 µm to 100 µm) with a high degree of crystal orientation. As such a device, for example, a device for printer head to be used in an inject printer, an ultrasonic transducer for transmitting and receiving ultrasonic waves in an ultrasonic probe, etc. can be cited.

Further, the case of fabricating a PZT film has been described in the first to fifth embodiments of the present invention, however, the present invention can be applied to the case of fabricating other ceramic films. Also in the case, a ceramic precursor material containing an amorphous component may be used as raw material powder in the AD method. Specifically, as a piezoelectric material other than PZT, $Pb(Mg_{1/3}Nb_{2/3})O_3$, $Pb(Zn_{1/3}Nb_{2/3})O_3$, $Pb(Ni_{1/3}Nb_{2/3})O_3$, complex compounds of those, and complex compounds of those and PZT can be cited. Further, ceramics such as MgO, SiC, $Si_3N_4$ and so on to be used as a heat-resistant material, ceramics such as $Al_2O_3$, TiC, $B_4C$, BN and so on to be used as a high-strength material, ceramics such as $Fe_2O_3$, (Mn,Zn)$Fe_2O_4$ and so on to be used as a magnetic material, ceramics such as $Ta_2O_5$, $Nb_2O_5$, $PbTiO_3$, $(Ca,Ba,Sr)TiO_3$, $(Li,K)(Nb,Ta)O_3$, $SrBi_2(Ta,Nb)_2O_9$, $Bi_4Ti_3O_{12}$ and so on to be used as a dielectric material, ceramics such as $ZrO_2$, $SnO_2$, ZnO, $La(Cr,Mn)O_3$, $TiO_2$ and so on to be used as a semiconductor material, ceramics such as $IrO_2$, $LaNiO_3$, $(Ca,Sr,Ba)RuO_3$, In—$SnO_2$ and so on to be used as a conducting material, ceramics such as $SiO_2$, $Y_3Al_5O_{12}$, $Y_3Fe_5O_{12}$, $(Pb,La)(Zr,Ti)O_3$ and so on to be used as an optical material, ceramics such as $YBa_2Cu_3O_7$, $Bi_2Sr_2Ca_2Cu_3O_{10}$, $La_2SrCuO_4$ and so on to be used as a superconducting material, ceramics such as $Na(Co,Cu)_2O_4$, $(Bi,Pb)Sr_3CO_2O_9$ and so on to be used as a thermoelectric material can be cited.

Further, in the first to fifth embodiments of the present invention, powder containing an amorphous component has been used as raw material powder, however, a ceramic precursor material having a pyrochlore-type structure may be used instead. In the case of PZT, in a general composition formula $A_2B_2O_7$ of the pyrochlore-type structure, A-site includes lead (Pb) and B-site includes zircon (Zr) and titanium (Ti). The pyrochlore-type structure is unstable, and therefore, it is conceivable that the pyrochlore-type structure has higher potential energy compared to perovskite-type structure (its general composition formula is $ABO_3$) as a typical crystalline structure of PZT. Therefore, also in the case where a precursor material containing the pyrochlore-type structure is used as raw material powder, a PZT film having good crystallinity can be fabricated without requiring heating treatment at relatively high temperature as in the first to fifth embodiments of the present invention. Alternatively, ceramic powder containing a component which produces exothermic reaction by being provided with energy from the outside at the time of film formation or heat treatment may be used as raw material powder.

In the above description, film formation has been performed by using the AD method, however, the present invention can be applied to various film formation technologies utilizing aerosols. For example, there are cited a method of depositing raw material powder on a substrate by supplying an aerosol, in which raw material powder is dispersed, into a chamber, in which the substrate is placed, without directly spraying it on the substrate, and HPPD (Hypersonic plasma particle deposition) method of fabricating a nano-crystal film by generating ultrafine particles of submicron or less under high pressure and spraying the ultrafine particles on a substrate at ultrasound speed.

The invention claimed is:

1. A method of manufacturing a ceramic film by using an aerosol, said method comprising the steps of:
   (a) dispersing ceramic raw material powder containing an amorphous component in a gas to generate an aerosol; and
   (b) supplying the aerosol generated at step (a) into a chamber in which a substrate is placed and depositing said ceramic raw material powder on said substrate to form a ceramic film,
   wherein step (b) includes forming the ceramic film while keeping said substrate at a predetermined temperature and crystallizing the amorphous component contained in the ceramic raw material powder on said substrate.

2. A method of manufacturing a ceramic film by using an aerosol, said method comprising the steps of:
   (a) dispersing ceramic raw material powder containing a component, which produces exothermic reaction by being provided with energy from outside, in a gas to generate an aerosol; and
   (b) supplying the aerosol generated at step (a) into a chamber in which a substrate is placed and depositing said ceramic raw material powder on said substrate to form a ceramic film,
   wherein step (b) includes forming the ceramic film while keeping said substrate at a predetermined temperature and crystallizing the ceramic raw material powder on said substrate.

3. A method according to claim 2, wherein said ceramic raw material powder includes gel powder.

4. A method according to claim 1, wherein step (b) includes depositing said ceramic raw material powder on said substrate by injecting the aerosol generated at step (a) from a nozzle toward said substrate.

5. A method according to claim 2, wherein step (b) includes depositing said ceramic raw material powder on said substrate by injecting the aerosol generated at step (a) from a nozzle toward said substrate.

6. A method of manufacturing a ceramic film by using an aerosol, said method comprising the steps of:
   (a) dispersing ceramic raw material powder containing an amorphous component in a gas to generate an aerosol;
   (b) supplying the aerosol generated at step (a) into a chamber in which a substrate is placed and depositing said ceramic raw material powder on said substrate to form a ceramic film; and
   (c) heating the ceramic film formed on said substrate at step (b) to crystallize the amorphous component contained in the ceramic film.

7. A method of manufacturing a ceramic film by using an aerosol, said method comprising the steps of:
   (a) dispersing ceramic raw material powder containing a component, which produces exothermic reaction by being provided with energy from outside, in a gas to generate an aerosol;
   (b) supplying the aerosol generated at step (a) into a chamber in which a substrate is placed and depositing said ceramic raw material powder on said substrate to form a ceramic film; and
   (c) heating the ceramic film formed on said substrate at step (b) to grow crystal grain in the ceramic film.

8. A method of manufacturing a ceramic film by using an aerosol, said method comprising the steps of:
   (a) dispersing ceramic raw material powder containing an amorphous component in a gas to generate an aerosol;
   (b) supplying the aerosol generated at step (a) into a chamber in which a substrate is placed and depositing said ceramic raw material powder on said substrate to form a ceramic film; and
   (c) applying electromagnetic waves to the ceramic film formed on said substrate at step (b) to crystallize the amorphous component contained in the ceramic film.

9. A method of manufacturing a ceramic film by using an aerosol, said method comprising the steps of:
   (a) dispersing ceramic raw material powder containing a component, which produces exothermic reaction by being provided with energy from outside, in a gas to generate an aerosol;
   (b) supplying the aerosol generated at step (a) into a chamber in which a substrate is placed and depositing said ceramic raw material powder on said substrate to form a ceramic film; and
   (c) applying electromagnetic waves to the ceramic film formed on said substrate at step (b) to grow crystal grain in the ceramic film.

10. A method of manufacturing a ceramic film by using an aerosol, said method comprising the steps of:
    (a) dispersing ceramic raw material powder containing an amorphous component in a gas to generate an aerosol;
    (b) supplying the aerosol generated at step (a) into a chamber in which a substrate is placed and depositing said ceramic raw material powder on said substrate to form a ceramic film; and
    (c) applying plasma to the ceramic film formed on said substrate at step (b) to crystallize the amorphous component contained in the ceramic film.

11. A method of manufacturing a ceramic film by using an aerosol, said method comprising the steps of:
    (a) dispersing ceramic raw material powder containing a component, which produces exothermic reaction by being provided with energy from outside, in a gas to generate an aerosol;

(b) supplying the aerosol generated at step (a) into a chamber in which a substrate is placed and depositing said ceramic raw material powder on said substrate to form a ceramic film; and (c) applying plasma to the ceramic film formed on said substrate at step (b) to grow crystal grain in the ceramic film.

12. A method according to claim 1, wherein said ceramic raw material powder includes a piezoelectric material.

13. A method according to claim 2, wherein said ceramic raw material powder includes a piezoelectric material.

14. A method according to claim 1, wherein said ceramic raw material powder includes at least one of $Pb(Zr,Ti)O_3$, $Pb(Mg_{1/3}Nb_{2/3})O_3$, $Pb(Zn_{1/3}Nb_{2/3})O_3$, $Pb(Ni_{1/3}Nb_{2/3})O_3$, $(Pb,La)(Zr,Ti)O_3$, $MgO$, $SiC$, $Si_3N_4$, $Al_2O_3$, $TiC$, $B_4C$, $BN$, $Fe_2O_3$, $Mn,Zn)$ $Fe_2O_4$, $Ta_2O_5$, $Nb_2O_5$, $PbTiO_3$, $(Ca,Ba,Sr)TiO_3$, $(Li,K)(Nb,Ta)O_3$, $SrBi_2(Ta,Nb)_2O_9$, $Bi_4Ti_3O_{12}$, $ZrO_2$, $SnO_2$, $ZnO$, $La(Cr,Mn)O_3$, $TiO_2$, $IrO_2$, $LaNiO_3$, $(Ca,Sr,Ba)RuO_3$, $In-SnO_2$, $SiO_2$, $Y_3Al_5O_{12}$, $Y_3Fe_5O_{12}$, $YBa_2Cu_3O_7$, $Bi_2Sr_2Ca_2Cu_3O_{10}$, $La_2SrCuO_4$, $Na(Co,Cu)_2O_4$, and $(Bi,Pb)Sr_3Co_2O_9$.

15. A method according to claim 2, wherein said ceramic raw material powder includes at least one of $Pb(Zr,Ti)O_3$, $Pb(Mg_{1/3}Nb_{2/3})O_3$, $Pb(Zn_{1/3}Nb_{2/3})O_3$, $Pb(Ni_{1/3}Nb_{2/3})O_3$, $(Pb,La)(Zr,Ti)O_3$, $MgO$, $SiC$, $Si_3N_4$, $Al_2O_3$, $TiC$, $B_4C$, $BN$, $Fe_2O_3$, $(Mn,Zn)Fe_2O_4$, $Ta_2O_5$, $Nb_2O_5$, $PbTiO_3$, $(Ca,Ba,Sr)TiO_3$, $(Li,K)(Nb,Ta)O_3$, $SrBi_2(Ta,Nb)_2O_9$, $Bi_4Ti_3O_{12}$, $ZrO_2$, $SnO_2$, $ZnO$, $La(Cr,Mn)O_3$, $TiO_2$, $IrO_2$, $LaNiO_3$, $(Ca,Sr,Ba)RuO_3$, $In-SnO_2$, $SiO_2$, $Y_3Al_5O_{12}$, $Y_3Fe_5O_{12}$, $YBa_2Cu_3O_7$, $Bi_2Sr_2Ca_2Cu_3O_{10}$, $La_2SrCuO_4$, $Na(Co,Cu)_2O_4$, and $(Bi,Pb)Sr_3CO_2O_9$.

16. A method according to claim 1, wherein a degree of crystallinity of said ceramic raw material powder is not larger than 50%.

17. A method according to claim 1, wherein step (b) includes depositing said ceramic raw material powder on a single-crystal substrate to form the ceramic film according to orientation of said single-crystal substrate.

18. A method according to claim 2, wherein step (b) includes depositing said ceramic raw material powder on a single-crystal substrate to form the ceramic film according to orientation of said single-crystal substrate.

* * * * *